United States Patent [19]

Lu

[11] Patent Number: 6,012,157
[45] Date of Patent: *Jan. 4, 2000

[54] SYSTEM FOR VERIFYING THE EFFECTIVENESS OF A RAM BIST CONTROLLER'S ABILITY TO DETECT FAULTS IN A RAM MEMORY USING STATES INDICATING BY FAULT SEVERITY INFORMATION

[75] Inventor: Bo Lu, San Jose, Calif.

[73] Assignee: LSI Logic Corporation, Milpitas, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/984,447

[22] Filed: Dec. 3, 1997

[51] Int. Cl.$^7$ .................................................. G06F 11/263
[52] U.S. Cl. .......................... 714/741; 714/719; 714/733
[58] Field of Search ..................................... 714/738, 737, 714/33, 744, 500.38, 741, 719, 733; 395/500.23, 500.35, 500.36; 365/201

[56] References Cited

U.S. PATENT DOCUMENTS

| | | |
|---|---|---|
| 3,702,011 | 10/1972 | Armstrong .................................. 714/33 |
| 4,204,633 | 5/1980 | Goel ........................................ 714/738 |
| 4,242,751 | 12/1980 | Henckels et al. ........................ 714/737 |
| 4,727,313 | 2/1988 | Barazilai et al. ........................... 714/33 |
| 4,763,289 | 8/1988 | Barzilai et al. ...................... 395/500.23 |
| 5,390,194 | 2/1995 | Mannle ................................... 714/744 |
| 5,410,678 | 4/1995 | Takasaki ............................ 395/500.36 |
| 5,475,624 | 12/1995 | West .................................. 395/500.36 |
| 5,513,339 | 4/1996 | Agrawal et al. .................... 395/500.36 |
| 5,633,813 | 5/1997 | Srinivasan .......................... 395/500.35 |
| 5,831,996 | 11/1998 | Abramovici et al. ................... 714/738 |

*Primary Examiner*—Albert De Cady
*Assistant Examiner*—David Ton

[57] ABSTRACT

A method and apparatus for testing a RAM BIST controller by initializing a RAM behavior model with known fault data, running a RAM BIST controller model along with the RAM behavior model, and then comparing the output of the RAM BIST controller model with the known fault data to determine if there are any differences. A difference will indicate a fault in the RAM behavior model. The accuracy of the RAM BIST controller can then be used to compare the design of the RAM BIST controller with designs for other RAM BIST controllers in order to find the ideal RAM BIST controller for the intended purposes.

18 Claims, 2 Drawing Sheets

| Fault Severity | Present State | Next State | Input data | Output data |
|---|---|---|---|---|
| For Example, 2 | 0 | 1 | Initialization | |
| | 1 | 2 | d | d |
| | 2* | 3 | d | d' = d modified by mask value |
| | 3 | 4 | d | d |
| | 4 | 5 | d | d |
| | 5 | End | d | d |

| Addr | Pass 1 | Pass 2 | Pass 3 | Addr | Pass 4 | Pass 5 |
|---|---|---|---|---|---|---|
| 1 | W(0)R(0) | R(0)W(1)R(1) | R(1)W(0)R(0) | N | R(0)W(1)R(1) | R(0)W(0)R(0) |
| 2 | W(0)R(0) | R(0)W(1)R(1) | R(1)W(0)R(0) | N-1 | R(0)W(1)R(1) | R(1)W(0)R(0) |
| ...... | | | | | | |
| N-1 | W(0)R(0) | R(0)W(1)R(1) | R(1)W(0)R(0) | 2 | R(0)W(1)R(1) | R(1)W(0)R(0) |
| N | W(0)R(0) | R(0)W(1)R(1) | R(1)W(0)R(0) | 1 | R(0)W(1)R(1) | R(1)W(0)R(0) |

*FIG. 4*

SYSTEM FOR VERIFYING THE EFFECTIVENESS OF A RAM BIST CONTROLLER'S ABILITY TO DETECT FAULTS IN A RAM MEMORY USING STATES INDICATING BY FAULT SEVERITY INFORMATION

BACKGROUND OF THE INVENTION

1. Field of the Invention

The present invention relates to the testing of random access memory (RAM) for defects. More particularly, this invention relates to verification of the accuracy of a random access memory built-in self test (RAM BIST) controller.

2. The Prior Art

RAM chips are widely used in various electronic components, most notably computers. The design and manufacture of these RAM chips, however, are not always perfect, opening the door for various types of defects. Defects may also arise during the lifetime of these chips. A defect in a RAM chip could cause serious problems, which include, among other things, the loss of important data and loss of computer function.

Due to concerns about RAM defects, many RAM chips now include a RAM BIST controller, sometimes called a RAM test controller, which tests for defects in the RAM. Normally, when in use in a computer, this RAM BIST controller will run tests on the RAM when the computer is powered up, and stop the operating system from loading if any defects in the RAM are found. Those skilled in the relevant art, however, will recognize that a RAM BIST controller could be used at any time during the life of the chip to test for defects, not just during power up, and it could be used by other electronic components as well, not just computers.

A RAM BIST controller generally operates by performing a RAM BIST, which involves writing patterns into the memory and reading them back for comparison. If a mismatch occurs between the pattern written in and the pattern read back, a defect is usually present in the memory. Currently, most RAM BIST controllers perform some variation of March test algorithm in testing for defects in the RAM. March tests include several March elements, each element comprising a sequence of read/write operations performed on one address. After all of these operations are completed, the same operations are repeated for the next address in either increasing or decreasing order. March tests are very effective for detecting stuck-at, stuck-open, transition, coupling, and data retention faults in the memory.

Despite these advantages, RAM BIST controllers have one major drawback: they are hardwired to the chip itself. Therefore, the determination of which testing algorithm is going to be used must be made when the RAM chip is being designed. The choice of which algorithm to use is a very important process since the choice made will eventually affect the ability of the RAM chip to detect faults in its own memory.

In order to aid in this selection process, different techniques of verifying the logic implementation of these RAM test algorithms have been attempted. One technique is to use a standard memory VHDL model with module testbench. However, since these standard modules are fault-free, they are unable to accurately test how the algorithm will perform in "real life" situations. They work by running the RAM BIST controller model on a model of how the RAM is supposed to perform. The major drawback of this method is that, in most cases, RAM is always "expected" to perform perfectly as that is how it is designed, yet "real world" problems seem to occur during the manufacture and use of the chips that can cause the RAM to perform in ways not expected. Without seeing how the RAM BIST controller would perform in a "real world" situation, a computer model of the RAM BIST controller is virtually useless. Another technique is to use a netlist fault simulation with specific tools. This test, however, has the disadvantage of having to be performed late in the design process, when design is near completion. A second disadvantage of the netlist fault simulation technique is that its run time is very long.

What is needed is a fast and accurate method of verifying the RAM test algorithm that can be implemented throughout the design stage to insure that the RAM chip design is rendered correctly the first time.

BRIEF DESCRIPTION OF THE INVENTION

In the preferred embodiment of the invention, a RAM behavioral model is first created to mimic the expected behavior of a RAM chip. This RAM behavioral model is then initialized with known fault data. The known fault data allows the RAM behavior model to emulate the "real world" types of faults, which include faults that occur at irregular times (e.g. a fault that does not appear the first time an address is used, appears during the second time the address is used, and then doesn't appear during the rest of the uses).

A RAM BIST controller model is then created to simulate the expected behavior of the RAM BIST controller, which would then be included on the RAM chip for use as a tester. The RAM BIST controller model then runs its tests on the RAM behavior model. The results of these tests can then be compared with the known fault data to determine how effective the RAM BIST controller model was in catching faults in the RAM behavior model. Different RAM BIST controller models may then be tested, allowing the user to choose the most effective design for inclusion on a RAM chip as a RAM BIST controller.

BRIEF DESCRIPTION OF THE DRAWINGS

FIG. 4 is a chart showing how a RAM BIST controller model may test a RAM behavioral model.

DETAILED DESCRIPTION OF THE INVENTION

Figures 1, 2, 3:
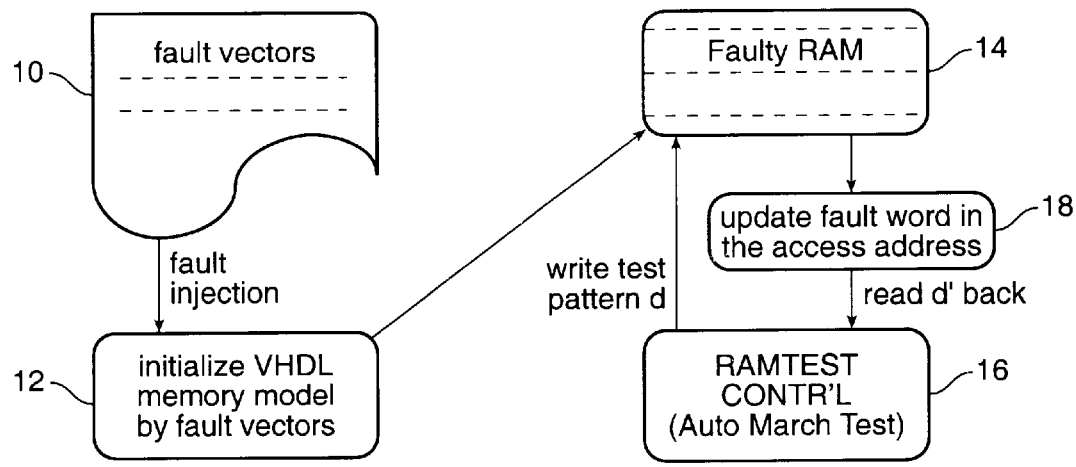
FIG. 1 shows a method for applying known fault data to a RAM behavioral model and then running a RAM BIST controller model on the RAM behavioral model.
FIG. 2 shows one embodiment of a fault vector.
FIG. 3 is a chart showing the different states of one type of RAM behavioral model as it affects one of the bytes of RAM.

Those of ordinary skill in the art will realize that the following description of the present invention is illustrative only and not in any way limiting. Other embodiments of the invention will readily suggest themselves to such skilled persons.

Modeling RAM behavior as well as RAM BIST controller behavior can be performed by any type of modeling tool. However, a hardware modeling language such as VHDL currently provides the most efficient means of carrying out the invention. In addition, depending upon the type of modeling tool implemented, the RAM behavior and the RAM BIST controller could either be modeled separately and then run together, or could both be the basis for one larger model which emulates the performance of both.

The introduction of known fault data into the RAM behavior model allows the RAM behavior model to more accurately reproduce the types of faults that occur when a real chip is actually used. There are many different ways to introduce such known fault data into a RAM behavior model, but the preferred embodiment is depicted in the figures. This invention is not meant to be limited to the embodiment depicted, however.

Referring first to FIG. 1, fault vectors 10 are injected into a VHDL memory model 12, creating faulty RAM 14. The RAM BIST controller model 16 then can perform its tests on the faulty RAM 14 by writing test patterns into the RAM, updating the information in the access address 18, and then reading the patterns back from the faulty RAM 14. The RAM BIST controller model 16 can then compare what was written to the faulty RAM 14 with what was read from the faulty RAM 14, with a difference indicating a fault in the faulty RAM 14. These faults could then be reported by the RAM BIST controller model through the use of an output file or an error message. This sequence could then be repeated for each address in RAM, and through the use of multiple passes for each address, depending on the design of the RAM BIST controller. After the RAM BIST controller model has finished performing its tests and reporting faults, the fault vectors 10 could then be compared with the faults found by the RAM BIST controller model, allowing the user to see how accurate the RAM BIST controller would be at finding faults.

FIG. 2 depicts the preferred embodiment for the known fault data, storing it in a group of records, or vectors. Each vector 30 would correspond to an address in the RAM, and would contain mask values in a first field 31, or a sequence of "X"s, "1"s, and "0"s, where an "X" in a particular position indicates that the particular bit is to be free of faults, a "1" indicating that the particular bit is to contain a "stuck-at-1" fault, and a "0" indicating that the particular bit is to contain a "stuck-at-0" fault. The second field 34 would contain the fault severity, or information as to what state the RAM BIST controller should be in when the fault occurs in the RAM behavior model. This, however, is only one possible form that the known fault data can take. Those skilled in the relevant art will recognize that the known fault data can take many different forms and this invention is not to be limited by the known fault data arrangement describe above.

These records making up the known fault data could be stored in the form of a text file. The text file could contain a array containing a record for each of the addresses of RAM. The RAM behavioral model would then only produce a fault as the fault vectors dictate. An example of this type of behavior is shown in FIG. 3. FIG. 3. shows the effect that a fault vector containing a "2" in its second field would have on a particular byte in the RAM behavior model, which would indicate that the fault contained in the first field should occur when the RAM BIST controller model is in state 2. At state 0, the RAM behavior model is initialized with the fault vectors. At state 1, any data d that is written into the byte would, when read, appear also as identical data d. Thus there is no fault in that byte at state 1. However, in state 2, any data d that is written into the byte would, when read, appear as d', which would indicate a fault in that byte at state 2. The term d' represents that the mask values for that byte, when added to d, produce an output that is different from d, which indicates a fault in one of the bits. States 3, 4, and 5 would run in a similar manner. State 5 would then send the model into an ending state for that particular byte, as the byte has completed its run. This simulates the "real world" type of faults that are encountered on RAM chips.

The RAM BIST controller model could then be run on the RAM behavioral model much in the same way as a RAM BIST controller would perform its testing on the RAM chip. One type of RAM BIST algorithm, called a 14N March algorithm, is depicted in FIG. 4. The algorithm is named a 14N March algorithm because fourteen read/write operations are performed on each one of N addresses of the RAM. A RAM BIST controller implementing a 14N March algorithm would perform as follows. A first pass is made through the RAM, beginning with the first address, consisting of writing a sequence of "01"s (i.e. 01010101 for a RAM that has eight bits per address), and then reading back from the address. The symbol "W(0)" in FIG. 4 represents writing this sequence of "01"s at a particular address. The symbol "R(0)" in FIG. 4 represents reading back from a particular address, expecting a sequence of "01"s. This process is repeated all the way through the RAM until the last address is tested. At each address, the RAM BIST controller examines whether the data written to the address is exactly the same as the data read from the address, and if it is not, it would return some sort of message or output indicating that a fault was encountered and in what address and bit (and state) it occurred.

A second pass is then made through the RAM, again beginning with the first address, but this time beginning by reading back the data contained in the address first. This data would then be compared with the data read from that address in the last pass, with a difference indicating a data retention fault. Then, a sequence of "10"s (i.e. 10101010 for a RAM that has eight bits per address) is written into the address at which point the RAM BIST controller again reads data back from the address, comparing the data read with the data written to determine if a fault occurred. The symbol "W(1)" in FIG. 4 represents writing this sequence of "10"s at a particular address. The symbol "R(1)" in FIG. 4 represents reading back from a particular address, expecting a sequence of "10"s. This sequence is repeated all the way through the RAM until the last address is tested.

A third pass is made through the RAM, once again beginning with the first address and beginning with a read of the data to see if there were any data retention faults. Then a sequence of "01"s is written into the address and read back, looking for faults. This sequence is repeated all the way through the RAM until the last address is tested.

A fourth pass is made through the RAM, this one acting exactly the same as pass 2 except beginning with the last address and progressing backward through the RAM until testing the first address.

A fifth pass is made through the RAM, this one acting exactly the same as pass 3 except beginning with the last address and progressing backward through the RAM until testing the first address.

The performance and accuracy of the RAM BIST controller model may then be checked by comparing the results of the RAM BIST controller model with the faults the model should have found (as indicated in the known fault data).

Those of ordinary skill in the art will recognize that this RAM BIST controller algorithm is very effective at detecting stuck-at, stuck-open, transition, coupling, and data retention faults. However, the present invention allows the user to improve upon this algorithm by testing out a variety of methods using a variety of RAM BIST controller designs and a variety of RAM designs without having to actually build a finished product prior to testing.

What is claimed is:

1. A method of verifying the effectiveness of a RAM BIST controller's ability to detect faults in a RAM memory, each portion of said RAM memory having one or more possible states, each state representing a discrete period in time, the method comprising:

introducing known fault data into a RAM system model, said known fault data comprising one or more records, each of said records containing a first field having mask values and a second field having fault severity information, said fault severity information indicating the state at which the faults should appear;

simulating the performance of the RAM memory and the RAM BIST controller through the user of a RAM system model, said RAM system model keeping track of the state of each byte in said RAM memory by tracking the number of times said byte has been accessed; and comparing the results of said RAM system model with said known fault data.

2. The method of claim 1, wherein said mask values comprise a sequence of "X"s, "1"s, and "0"s indicating bit faults, wherein an "X" indicates the bit is fault tree, a "1" indicates a "stuck-at-1" bit fault, and a "0" indicates a "stuck at 0" bit fault.

3. The method of claim 1, wherein said step of comparing the results of said RAM system model with said known fault data comprises the steps of:

comparing said mask values with the result of said RAM system model to determine if said simulation of the RAM BIST controller correctly indicated faults at the corresponding bits; and comparing said fault severity information with the result of said RAM system model to determine if said RAM BIST controller indicated faults at the corresponding bits during the correct states.

4. The method of claim 1, wherein said step of simulating the performance of RAM memory and a RAM BIST controller through the use of said RAM system model includes using the modeled RAM BIST controller to make a plurality of passes.

5. The method of claim 4, wherein one of said plurality of passes comprises the steps of writing a sequence of "01"s into the first address of the modeled RAM, reading back said first address of the modeled RAM, indicating a fault if the data read back does not match the data last read from said first address of the modeled RAM, and repeating these steps for each address in the modeled RAM, progressing upward through the addresses, until the last address is reached.

6. The method of claim 4, wherein one of said plurality of passes comprises the steps of reading back said first address of the modeled RAM, indicating a fault if the data read back does not match the data last read from said first address of the modeled RAM, writing a sequence of "10"s into the first address of the modeled RAM, reading back said first address of the modeled RAM, indicating a fault if the data read back does not match the data last read from said first address of the modeled RAM, and repeating these steps for each address in the modeled RAM, progressing upward through the addresses, until the last address is reached.

7. The method of claim 4, wherein one of said plurality of passes comprises the steps of reading back said first address of the modeled RAM indicating a fault if the data read back does not match the data last read from said first address of the modeled RAM, writing a sequence of "01"s into the first address of the modeled RAM, reading back said first address of the modeled RAM, indicating a fault if the data read back does not match the data last read from said first address of the modeled RAM, and repeating these steps for each address in the modeled RAM, progressing upward through the addresses, until the last address is reached.

8. The method of claim 4, wherein one of said plurality of passes comprises the steps of reading back said last address of the modeled RAM, indicating a fault if the data read back does not match the data last read from said last address of the modeled RAM, writing a sequence of "10"s into the last address of the modeled RAM, reading back said last address of the modeled RAM, indicating a fault if the data read back does not match the data last read from said last address of the modeled RAM, and repeating these steps for each address in the modeled RAM progressing downward through the addresses, until the first address is reached.

9. The method of claim 4, wherein one of said plurality of passes comprises the steps of reading back said last address of the modeled RAM, indicating a fault if the data read back does not match the data last read from said last address of the modeled RAM, writing a sequence of "01"s into the last address of the modeled RAM, reading back said last address of the modeled RAM, indicating a fault if the data read back does not match the data last read from said last address of the modeled RAM, and repeating these steps for each address in the modeled RAM, progressing downward through the addresses, until the first address is reached.

10. An apparatus for verifying the effectiveness of a RAM BIST controller's ability to detect faults in a RAM memory, each portion of said RAM memory having one or more possible states, each state representing a discrete period in time, the method comprising:

a RAM behavioral model, said RAM system model having means for keeping track of the state of each byte in said RAM memory by tracking the number of times said byte has been accessed;

a RAM BIST controller model;

means for introducing known fault data into said RAM system model, said known fault data comprising one or more records, each of said records containing a first field having mask values and a second field having fault severity information, said fault severity information indicating the state at which the faults should appear; and means for comparing the results of said RAM system model with said known fault data.

11. The apparatus of claim 10, wherein said mask values comprise a sequence of "X"s, "1"s, and "0"s indicating bit faults, wherein an "X" indicates the bit is fault tree, a "1" indicates a "stuck-at-1" bit fault, and a "0" indicates a "stuck at 0" bit fault.

12. The apparatus of claim 10, wherein said means for comparing the results of said RAM system model with said known fault data comprises:

means for comparing said mask values with the result of said RAM system model to determine if said simulation of the RAM BIST controller correctly indicated faults at the corresponding bits; and means for comparing said fault severity information with the result of said RAM system model to determine if said RAM BIST controller indicated faults at the corresponding bits during the correct states.

13. The apparatus of claim 10, wherein said means for simulating the performance of RAM memory and a RAM BIST controller through the use of said RAM system model includes means for using the modeled RAM BIST controller to make a plurality of passes.

14. The apparatus of claim 13, wherein one of said plurality of passes comprises writing a sequence of "01"s into the first address of the modeled RAM, reading back said first address of the modeled RAM, indicating a fault if the data read back does not match the data last read from said first address of the modeled RAM, and repeating these steps for each address in the modeled RAM, progressing upward through the addresses, until the last address is reached.

15. The apparatus of claim 13, wherein one of said plurality of passes comprises reading back said first address of the modeled RAM, indicating a fault if the data read back does not match the data last read from said first address of the modeled RAM, writing a sequence of "10"s into the first address of the modeled RAM, reading back said first address of the modeled RAM, indicating a fault if the data read back does not match the data last read from said first address of the modeled RAM, and repeating these steps for each address in the modeled RAM, progressing upward through the addresses, until the last address is reached.

16. The apparatus of claim 13, wherein one of said plurality of passes comprises reading back said first address of the modeled RAM indicating a fault if the data read back does not match the data last read from said first address of the modeled RAM, writing a sequence of "01"s into the first address of the modeled RAM, reading back said first address of the modeled RAM, indicating a fault if the data read back does not match the data last read from said first address of the modeled RAM, and repeating these steps for each address in the modeled RAM, progressing upward through the addresses, until the last address is reached.

17. The apparatus of claim 13, wherein one of said plurality of passes comprises reading back said last address of the modeled RAM, indicating a fault if the data read back does not match the data last read from said last address of the modeled RAM, writing a sequence of "10"s into the last address of the modeled RAM, reading back said last address of the modeled RAM, indicating a fault if the data read back does not match the data last read from said last address of the modeled RAM, and repeating these steps for each address in the modeled RAM progressing downward through the addresses, until the first address is reached.

18. The apparatus of claim 13, wherein one of said plurality of passes comprises the steps of reading back said last address of the modeled RAM, indicating a fault if the data read back does not match the data last read from said last address of the modeled RAM, writing a sequence of "01"s into the last address of the modeled RAM, reading back said last address of the modeled RAM, indicating a fault if the data read back does not match the data last read from said last address of the modeled RAM, and repeating these steps for each address in the modeled RAM, progressing downward through the addresses, until the first address is reached.

* * * * *